(12) United States Patent
Anthony

(10) Patent No.: US 6,205,053 B1
(45) Date of Patent: Mar. 20, 2001

(54) MAGNETICALLY STABLE MAGNETORESISTIVE MEMORY ELEMENT

(75) Inventor: Thomas C. Anthony, Sunnyvale, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/597,958

(22) Filed: Jun. 20, 2000

(51) Int. Cl.[7] .................................................. G11C 11/15
(52) U.S. Cl. ............................................ 365/173; 365/158
(58) Field of Search .................................. 365/173, 171, 365/157, 158

(56) References Cited

U.S. PATENT DOCUMENTS 5,757,695 * 5/1998 Shi et al. .............................. 365/158
5,966,323 * 10/1999 Chen et al. ........................... 365/158

* cited by examiner

*Primary Examiner*—Tan T. Nguyen

(57) ABSTRACT

A magnetoresistive memory cell includes first and second conductive magnetic layers. One of the first and second layers is substantially "H" or "I" shaped. A separation layer is disposed between the first and second layers. In various embodiments, the separation layer is either conductive or nonconductive. In various embodiments, at least one of the first and second layers comprises one of a nickel-iron (NiFe), cobalt-iron (CoFe), or a nickel-iron-cobalt (NiFeCo) alloy. In one embodiment, the memory cell apparatus includes conductive magnetic reference and data layers. The data layer is substantially "H" or "I" shaped. A separation layer is disposed between the reference and data layers. The cell may be a tunneling magnetoresistive cell or a giant magnetoresistive cell. The separation layer is nonconductive in one embodiment and conductive in an alternative embodiment. In various embodiments, one of the reference and data layers comprises one of a nickel-iron, cobalt-iron, or a nickel-iron-cobalt alloy.

19 Claims, 3 Drawing Sheets

MAGNETICALLY STABLE MAGNETORESISTIVE MEMORY ELEMENT

FIELD OF THE INVENTION

This invention relates to the field of nonvolatile memories. In particular, this invention is drawn to magnetic memory cells.

BACKGROUND OF THE INVENTION

One type of nonvolatile memory relies on a magnetoresistive effect referred to as the giant magnetoresistive (GMR) effect. GMR-based magnetic memory cells are multilayered structures comprising a nonmagnetic layer sandwiched by conductive magnetic layers. The magnetic state of the cell is determined by the relative orientation of a magnetic vector in one magnetic layer to a magnetic vector in another magnetic layer (e.g., parallel or anti-parallel). The resistance of the cell differs according to the relative orientations of the magnetic vectors. Accordingly the state of the cell can be determined by applying a voltage across the cell and measuring a resulting sense current.

The layers of magnetic material are typically formed as geometrically patterned films such as squares or rectangles. One disadvantage of patterned magnetic layer storage structures is that multiple magnetic domains may form in the magnetic layers, rendering the state of the cell indeterminate during read operations. Variation in the magnetic domain configuration of the cell may also lead to fluctuations in the magnetic switching field (i.e., coercivity) of the cell.

In order to reduce the ambiguities introduced by the magnetic domains, shape anisotropy is frequently introduced by increasing one dimension (e.g., length) of a layer with respect to another dimension (e.g., width) of the layer in order to reduce the number of domain states. One disadvantage of the rectangular shape as opposed to the square shape, however, is a significant reduction in the memory density.

SUMMARY OF THE INVENTION

In view of limitations of known systems and methods one embodiment of a magnetoresistive memory cell includes first and second conductive magnetic layers. One of the first and second layers is substantially "H" or "I" shaped. A separation layer is disposed between the first and second layers. In various embodiments, the separation layer is either conductive or nonconductive. In various embodiments, at least one of the first and second layers comprises one of a nickel-iron (NiFe), cobalt-iron (CoFe), or a nickel-iron-cobalt (NiFeCo) alloy.

In one embodiment, the memory cell apparatus includes conductive magnetic reference and data layers. The data layer is substantially "H" or "I" shaped. The presence of the "H" or "I" shaped geometry imparts a stabilizing uniaxial shape anisotropy to the data layer of the memory cell. A separation layer is disposed between the reference and data layers. The cell may be a tunneling magnetoresistive cell or a giant magnetoresistive cell. The separation layer is nonconductive in one embodiment and conductive in an alternative embodiment. In various embodiments, one of the reference and data layers comprises one of a nickel-iron, cobalt-iron or a nickel-iron-cobalt alloy.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The giant magnetoresistive (GMR) effect results from a change in resistance observed in a multilayer ferromagnetic/nonmagnetic structure when relative orientations of magnetic vectors in alternate magnetic layers change as a function of an applied field. The resistance of the structure is a function of the angle between the magnetic vectors in adjacent magnetic layers. Magnetic vectors with the same orientation are referred to as "parallel." Magnetic vectors of opposite orientation are referred to as antiparallel.

The electrical resistivity of multilayered ferromagnetic/nonmagnetic structures thus depends on the relative orientations of the magnetic vectors of different magnetic layers. Typically, a parallel alignment of the magnetic vectors presents a low resistivity condition. When the vectors of the magnetic layers are antiparallel, the resistivity of the multilayer structure is at a maximum. Intermediate resistivities are observed for other relative orientations of the magnetic vectors.

Figure 1:
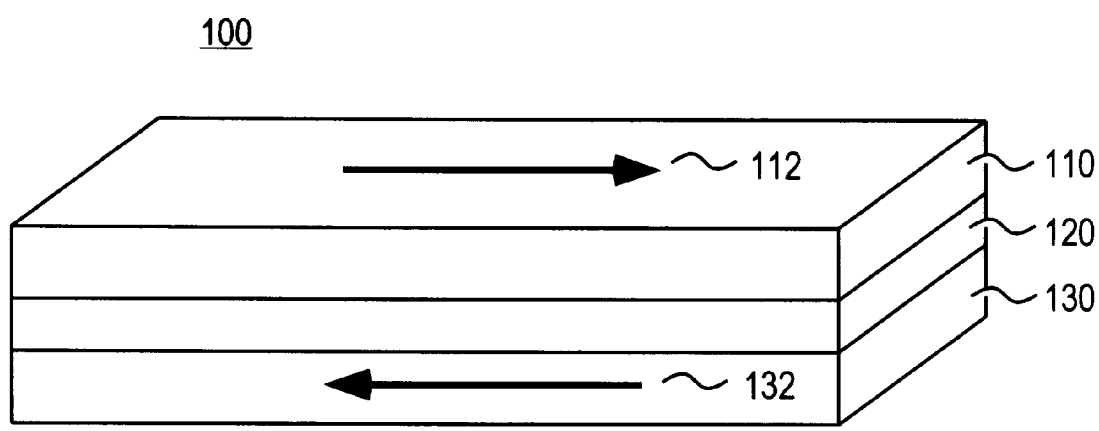
FIG. 1 illustrates one embodiment of a spin dependent magnetoresistive memory cell.

FIG. 1 illustrates one embodiment of a magnetic memory cell 100 having a nonmagnetic separation layer 120 sandwiched between two magnetic film layers 110 and 130. Each of the magnetic layers has a magnetic vector 112 and 132. The illustrated magnetic vectors 112 and 132 are antiparallel. When the magnetic vectors have the same orientation, they are referred to as parallel. The magnetic layers 110 and 130 are conductive metallic layers. Typically, magnetic layers 110 and 130 comprise a nickel—iron (NiFe), cobalt—iron (CoFe), or a nickel—iorn—cobalt (NiFeCo) alloy. The resistance between layer 110 and 130 is R1 when magnetic vectors 112 and 132 are parallel. The resistance increases by an amount, dR1, when magnetic vectors 112 and 132 are anti-parallel. Typically magnetic layers 110 and 130 have different coercivities.

In one type of magnetic memory cell separation layer 120 is a conductive metallic layer. Such a cell is referred to as a "GMR" cell and metallic conduction through the separation layer is the primary transport mechanism for current flow between the two magnetic layers. When the separation layer 120 is a dielectric or nonconductive barrier, current flow can be accomplished by quantum mechanical tunneling between magnetic layers 110 and 130, if the barrier is sufficiently thin. Such a cell is referred to as a tunneling magnetoresistive (TMR) cell.

Magnetoresistive memory cells can be constructed such that the magnetic vector in one of the layers is "pinned" to prevent changes. Such cells are referred to as spin valve cells. If layer 130 is pinned, then layer 110 is referred to as the data or sense layer and layer 130 is referred to as the reference layer. The state of the cell is determined by the relative orientation of the magnetic vectors between the data and reference layers. Given that the reference layer has a fixed magnetic vector 132, cell 100 is capable of representing 2 states corresponding to a single bit of information.

The magnetic cell structure is also referred to as a stack and may contain other layers in addition to the reference, separation, and data layers. In particular, each of the reference and the data layers may be coupled to conductors (not illustrated) to facilitate sensing the state of the cell. Regardless of the number or type of layers, the term "GMR" is used to refer to a magnetoresistive cell having metallic conduction as the primary current transport mechanism between the reference and data layers. Similarly, the term "TMR" is used to refer to a magnetoresistive cell having quantum mechanical tunneling as the primary current transport mechanism between the reference and data layers regardless of the number or type of layers.

Patterned magnetic layers generate a magnetostatic field that tends to demagnetize the layer. At the edge of a patterned film, this demagnetization field is typically larger than any anisotropy terms maintaining the magnetization perpendicular to the pattern edge. As a result, the magnetostatic field tends to rotate the magnetic vector of the film near the edges. Magnetization rotation near the edges form domain walls within the magnetic film creating multiple domains of magnetic vectors wherein the magnetic vectors of the domains are not all aligned. When reading the magnetic memory element, the multiple domains tend to create noise or areas of varying resistance across the cell that makes determination of the state of the written cell difficult or impossible. In addition, variation in the domain state can produce fluctuations in the switching field that can render the writing process unpredictable.

Figure 2:
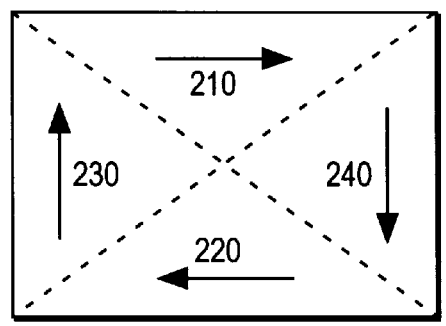
FIG. 2 illustrates a magnetic domain pattern in an isotropic magnetic film.

FIG. 2 illustrates the magnetic domain pattern in magnetically isotropic thin film patterned as a rectangle. Ideally, for memory applications the film should have a single magnetic vector. As indicated, however, domains of different magnetic vector orientations tend to form. In this example, four domains (210, 220, 230, and 240) each with a different magnetic vector result. Such a magnetization state in the data layer would not be functional in a memory cell because there is no preferred magnetization direction.

Magnetic anisotropy refers generally to the exhibition of preferred directions of magnetization in a magnetic material. The introduction of anisotropy may significantly ameliorate the effect of the demagnetization field. For example, variations in composition or shape can contribute to the magnetic anisotropy observed. Magnetocrystalline anisotropy refers to the influence of material composition and crystallographic orientation on the directional dependence of the ability to magnetize a sample in a magnetic field. Films commonly selected for use in magnetic nonvolatile memory applications exhibit uniaxial magnetocrystalline anisotropy. The material is easier to magnetize along a particular axis. This axis is typically referred to as the "easy axis" of the film.

Figure 3:
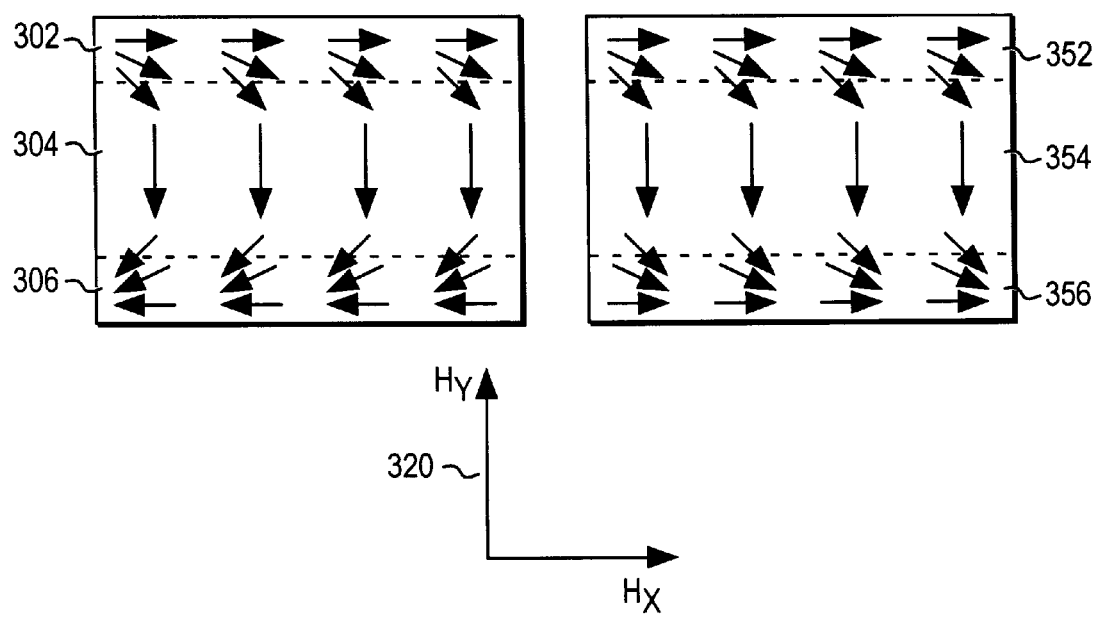
FIG. 3 illustrates magnetic domain patterns in magnetic films having y-axis uniaxial anisotropy.

FIG. 3 illustrates domains in a patterned rectangular cell having uniaxial anisotropy in the y direction (i.e., the y axis is the easy axis). Although the resulting domain configuration is improved over that of FIG. 2, the magnetic vectors of the horizontally oriented edge domains 302, 306 and 352, 356 have similar probabilities of being in each of the four possible orientations. This domain configuration results in domain states that cannot be guaranteed upon writing a value to the cell. This in turn results in an increase in noise level when attempting to read the contents of the memory cell and uncertainty in the magnetic field required to write.

Figure 4:
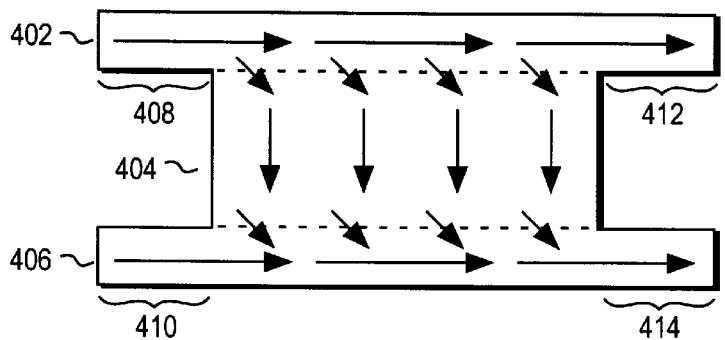
FIG. 4 illustrates a magnetic domain pattern in an H-shaped magnetic film also having y-axis uniaxial anisotropy.

FIG. 4 illustrates an "H" or "I" shaped film geometry that adds uniaxial shape anisotropy to the magnetic film. Shape anisotropy describes the influence of geometry on the directional dependence of the ability to magnetize an otherwise magnetically isotropic sample in an applied magnetic field. Generally, magnetization of a film along its shortest dimension is more difficult because the demagnetizing field is greatest in that direction. For a rectangular magnetic element of thickness T and width W, the shape anisotropy is determined as $H_{shape}=4\pi M_s T/W$, where $M_s$ is the saturation magnetization of the element. Extensions or tabs (e.g., 408, 410, 412, 414) change the square geometry into an H-shaped layer with domains largely corresponding to the components 402, 404, 406 of the H-shape. Magnetization is constrained to be parallel to the long dimension of the tabs by shape anisotropy which is on the order of several hundred Oersteds for materials typically envisioned for use in magnetic memory cells. The terms "H" and "I" will be used interchangeably to refer to the shape of the structure illustrated in FIG. 4.

Although domains 402, 406 still form near the edges, the use of shape anisotropy helps to ensure predictability with respect to the orientation of the vectors within the edge domains 402 and 406. Thus, the shape anisotropy in combination with an initialization field applied along the x axis produces a domain configuration with reproducible states. FIG. 4 illustrates the magnetization orientation after application of a field in the positive x direction. In particular, the H-shaped geometry tends to eliminate potential read and write ambiguities by reducing the number of domain states.

Writing to the cell having the data layer 400 predominately varies only the orientation of the vectors within domain 404. Once set, the magnetization orientations of edge regions 402 and 406 are fixed by the large shape anisotropy in the tabs. Thus although the layer geometries of FIGS. 3 and 4 both result in 3 domains, the geometry of FIG. 4 tends to result in fewer possible states for realizing the same stored value. This in turn reduces the ambiguities when reading and writing the cell.

Figure 5:
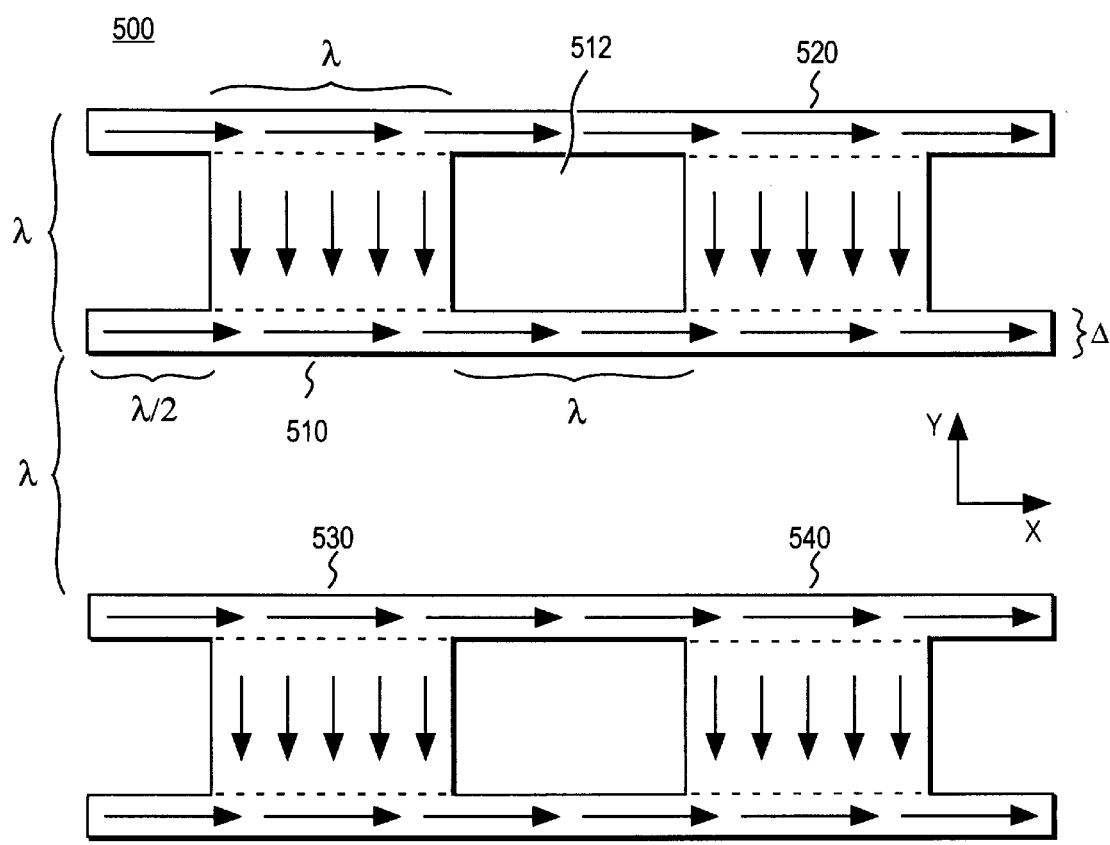
FIG. 5 illustrates an H-shaped sense layer of a plurality of memory cells in an array.

FIG. 5 illustrates the H-shaped sense layers 510, 520, 530, and 540 for a plurality of memory cells forming array 500. With the H-shaped sense layer, the cells can be spaced as closely as a single minimum line width apart in both x and y directions and yet maintain a predictable magnetization state in each memory cell. Thus for a minimum pitch of $2\lambda$, the cells can be spaced as closely as $\lambda$ apart. The cell has the dimensions of $2\lambda$ on each side (including the space between cells) resulting in an area of $4\lambda^2$.

In one embodiment the height ($\Delta$) of the tabs is 10%–25% of $\lambda$. Typically, etching processes are capable of modifying photolithographically defined features to produce dimensions that are less than the minimum photolithographic resolution $\lambda$. Thus although $2\lambda$ represents a photolithographic limit for line pitch (i.e., the sum of the line dimension and the space dimension) etching processes such as reactive ion etching can be used to shrink the linewidth by $2\Delta$ while at the same time increasing the space between lines by $2\Delta$. Such reactive ion etch processes in combination with other conventional processing techniques known to those skilled in the art can be used to create the tab regions of width $\Delta$ as depicted in FIG. 5.

The introduction of shape anisotropy using the H-geometry also reduces the range of magnetic fields needed to write. Referring to FIG. 3, for example, a write is performed by application of fields along two axes 320. These fields can be generated by passing current through orthogonal conductors located either above or below the cell. The orientation of the magnetic vectors in domains 352 and 356 is the same as that of field Hx for cell 350. The orientation of the magnetic vector in domain 306 for cell 300, however, is opposite the orientation of field Hx. Accordingly, cells 300 and 350 will switch at different values of Hy, suggesting that a wider range of currents is required to write to a given state without regard to the present state. In contrast, the orientation of the magnetic vectors in the edge domains is substantially the same for all the cells in the array 500. Thus a narrower range of write currents is required to program the cells having H-shaped data layers.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A memory cell apparatus comprising:
   a first and a second magnetic layer, wherein at least one of the first and second layers is substantially "H" shaped; and
   a separation layer pair disposed between the first and second layers.

2. The apparatus of claim 1 wherein the separation layer is conductive.

3. The apparatus of claim 1 wherein the separation layer is nonconductive.

4. The apparatus of claim 1 wherein the first and second layers have distinct coercivities.

5. The apparatus of claim 1 wherein one of the first and second layers is pinned.

6. The apparatus of claim 1 wherein at least one of the first and second layers comprises one of a nickel-iron (NiFe), cobalt-iron (CoFe), and a nickel—iron-cobalt (NiFeCo) alloy.

7. A memory cell apparatus comprising:
   a magnetic reference layer and a magnetic data layer, wherein the data layer is substantially "H" shaped; and
   a separation layer disposed between the reference and data layers.

8. The apparatus of claim 7 wherein the memory cell is a giant magnetoresistive (GMR) cell.

9. The apparatus of claim 7 wherein the memory cell is a tunneling magnetoresistive (TMR) cell.

10. The apparatus of claim 7 wherein the reference and data layers have distinct coercivities.

11. The apparatus of claim 7 wherein at least one of the reference and data layers comprises one of a nickel-iron (NiFe), cobalt-iron (CoFe), and a nickel-iron-cobalt (NiFeCo) alloy.

12. A memory apparatus comprising:
    a plurality of magnetoresistive memory cells, each cell having an "H" shaped data layer.

13. The apparatus of claim 12 wherein each cell further comprises:
    a reference layer; and
    a separation layer disposed between the sense and reference layers.

14. The apparatus of claim 13 wherein the separation layer is nonconductive.

15. The apparatus of claim 13 wherein the separation layer is conductive.

16. The apparatus of claim 13 wherein the memory cell is a giant magnetoresistive (GMR) cell.

17. The apparatus of claim 13 wherein the memory cell is a tunneling magnetoresistive (TMR) cell.

18. The apparatus of claim 13 wherein the reference and data layers have distinct coercivities.

19. The apparatus of claim 13 wherein at least one of the reference and data layers comprises one of a nickel-iron (NiFe), cobalt-iron (CoFe), and a nickel-iron-cobalt (NiFeCo) alloy.

* * * * *